(12) United States Patent
Steffen et al.

(10) Patent No.: US 7,593,172 B2
(45) Date of Patent: Sep. 22, 2009

(54) ADJUSTABLE OPTICAL ASSEMBLY

(75) Inventors: Roman Steffen, Rebstein (CH); Lieu-Kim Dang, Gams (CH); Detlef Juesten, Sennwald (CH)

(73) Assignee: Hilti Aktiengesellschaft, Schaan (LI)

( * ) Notice: Subject to any disclaimer, the term of this patent is extended or adjusted under 35 U.S.C. 154(b) by 247 days.

(21) Appl. No.: 11/879,320

(22) Filed: Jul. 16, 2007

(65) Prior Publication Data
US 2008/0074751 A1 Mar. 27, 2008

(30) Foreign Application Priority Data
Jul. 17, 2006 (DE) .................. 10 2006 000 343

(51) Int. Cl.
*G02B 7/02* (2006.01)

(52) U.S. Cl. .................. 359/819; 359/813; 359/821

(58) Field of Classification Search .................. 359/819, 359/811, 813, 814, 821, 822, 823
See application file for complete search history.

(56) References Cited

U.S. PATENT DOCUMENTS
2005/0179805 A1* 8/2005 Avron et al. .................. 348/340

* cited by examiner

*Primary Examiner*—Timothy J Thompson
(74) *Attorney, Agent, or Firm*—Abelman, Frayne & Schwab

(57) ABSTRACT

An optical assembly has an optics carrier (2) which is adjustable with respect to an axis (A) and to which at least two optical elements are fixedly connected, with the optics carrier (2) including at least two partial carriers (5a, 5b), each of which secures an optical element, and with the two partial carriers (5a, 5b) being connected to one another by at least three axially elongate, flexible connection members (6) which are spaced apart in a plane and secured by frictional engagement in corresponding associated connection openings (8) so as to be displaceable axially.

9 Claims, 2 Drawing Sheets

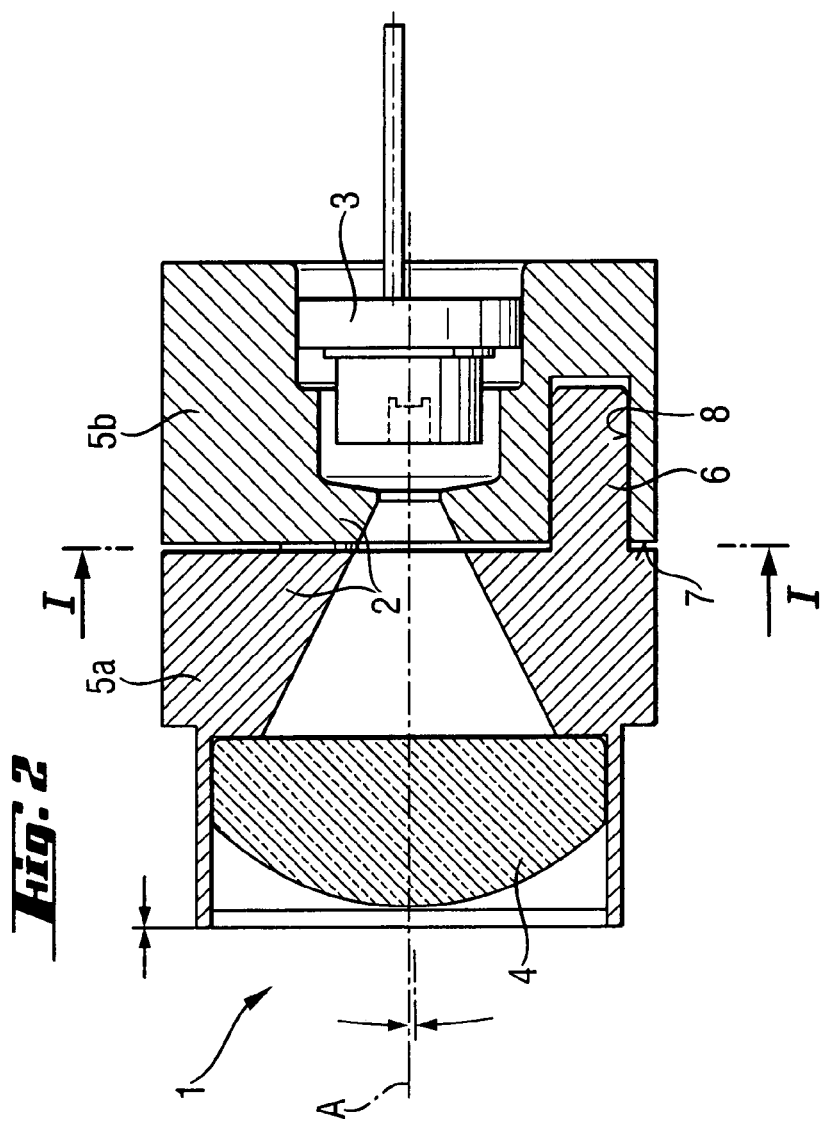
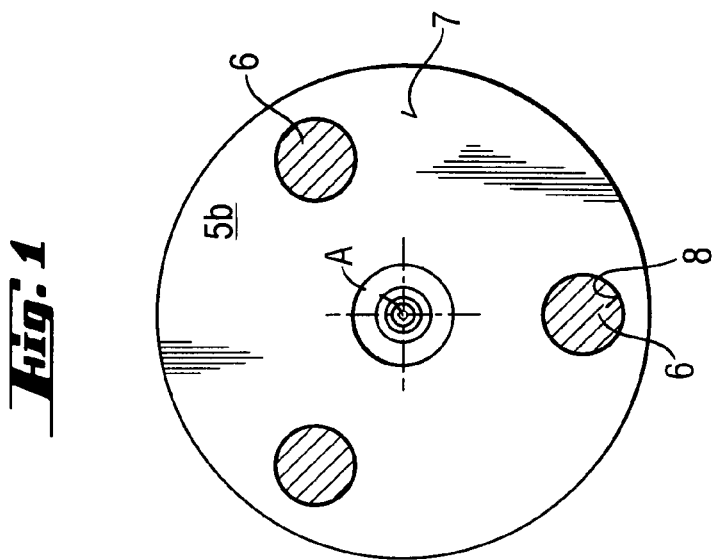

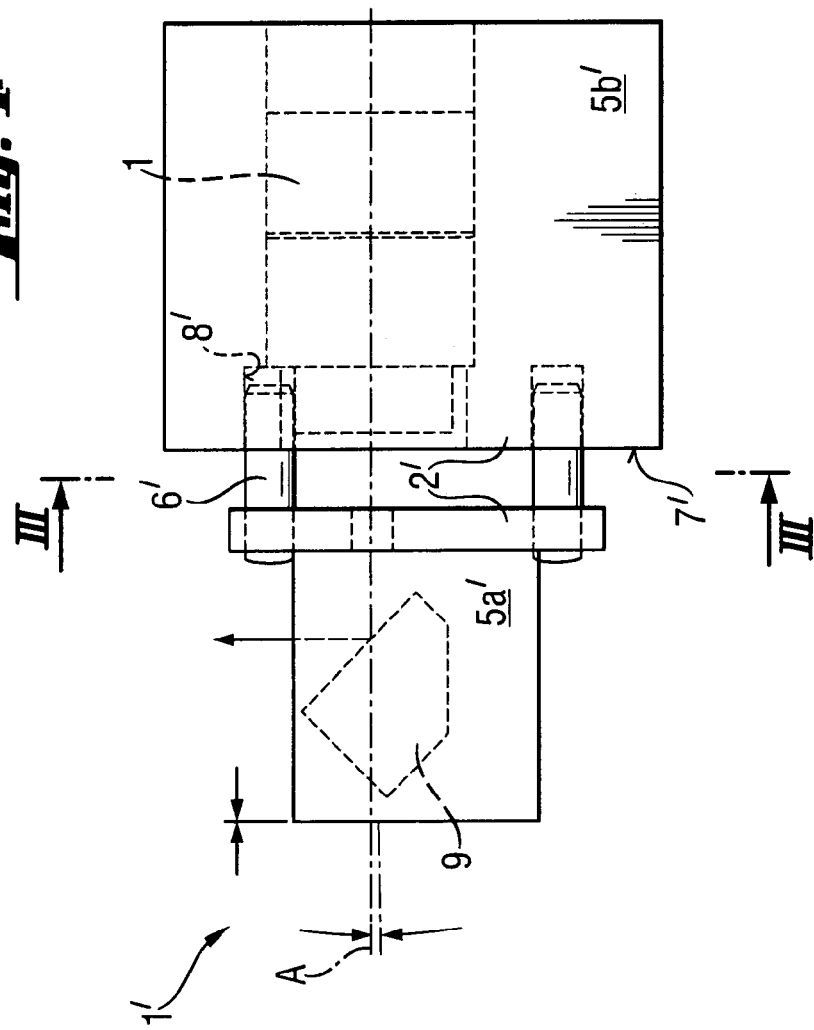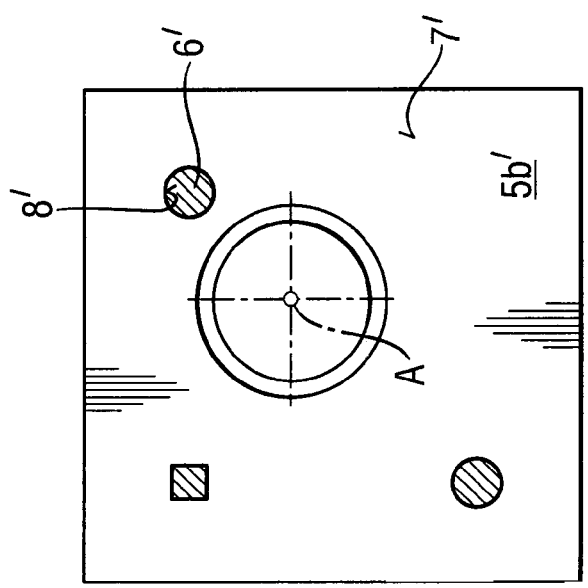

ADJUSTABLE OPTICAL ASSEMBLY

BACKGROUND OF THE INVENTION

1. Field of the Invention

The invention is directed to an adjustable optical assembly, particularly to focusable collimating optics for laser diodes and a focused beamsplitter for optoelectronic surveying instruments.

2. Description of the Prior Art

Laser diodes require collimating optics in order to parallelize the beam bundle. After mounting the laser diode and the collimating lens in an optics carrier for collimating optics, their position relative to one another must be adjusted. This adjustment has axial displacements (focus) and inclinations.

During manufacture of simple collimating optics, the laser diodes and collimating lens are not secured until after the adjustment. This securing process, for example, cementing, requires time which is burdensome in a large-scale production.

According to German Utility Model DE9002698U, collimating optics have a centering ring for the laser diode. This centering ring can be secured axially in the housing by a holding member and can be adjusted in the XY plane by means of the adjusting elements cooperating with a circumferential surface of the centering ring.

According to U.S. Pat. No. 6,657,788, an adjustable optical assembly with collimating optics and a prism has thin, axially oriented, deformable deformation webs between the collimating optics and the prism. These deformation webs are formed around holes which are offset circumferentially in a cylindrical sleeve serving as an optics carrier, partial beams reflected by the prism exiting through these holes. The collimating optics are adjusted by means of the plastically deformed deformation webs.

Japanese Publication JP2003101119 discloses a laser diode collimating lens carrier unit, wherein the laser diode is pressed into the tubular carrier part so as to be axially adjustable and the collimating lens is connected by a plastically deformable tube portion such that it can be displaced laterally.

German Publication DE19702573 discloses a tubular laser diode collimating lens carrier unit in which the collimating lens is connected by a press fit to a partial carrier sleeve by inner runners of the carrier sleeve.

Plastic bending crosspieces for adjustment in an integrally formed carrier unit are also disclosed in U.S. Pat. No. 4,930,858.

SUMMARY OF THE INVENTION

It is the object of the invention to realize a simple adjustable optical assembly which is suitable for a large-scale production and which has a large adjustment range.

This and other objects of the present invention, which will become apparent hereinafter, are achieved by providing an optical assembly which is adjustable with respect to an axis and has an optics carrier to which at least two optical elements are fixedly connected. The optics carrier includes at least two partial carriers, each of which secures an optical element and which are connected to one another by at least three axially elongate, flexible connection members which are spaced apart in a plane and are secured by frictional engagement in matching connection openings so as to be displaceable axially.

The optics carrier itself is displaceable axially by means of the elongate connection members which are adjustable in a frictionally engaging manner. It is also tiltable in itself, and the bending deformations required for this purpose are carried out substantially in the three axially flexible connection members which are spaced apart in a plane and which together form at least one three-point fixation. For adjustment in a suitably automated adjustment unit, the connection members are each pressed into the associated connection openings exactly far enough so that the axial distance and axial inclination are optimally adjusted to one another. This makes possible an exact positioning of the partial carriers relative to one another in the range of micrometers and angular seconds.

The connection members and the associated connection openings are advantageously arranged at the axial end faces of the partial carriers and, further, are advantageously distributed in a symmetric manner so that, given a frictional engagement per connection, the rigidity of the structural component parts of the adjusted optics carrier is maximized.

The connection members are advantageously pin-shaped, i.e., shaped prismatically in a geometric sense as a body with equal cross-sectional surfaces offset in parallel, e.g., cylindrically, triangularly, rectangularly, etc., so that the fit of the connection members in the associated correspondingly shaped connection openings does not vary as the result of an axial displacement.

The connection members are advantageously constructed as cylindrical pins and the connection openings are advantageously shaped as cylindrical holes so that there is rotational symmetry with respect to an individual connection.

The connection members advantageously form a plurality of parts with the partial carrier so that standardized connection members which are available as series-produced articles can be used, e.g., sufficiently thin, flexible metal pins of copper or aluminum.

Alternatively, the connection members are advantageously formed integral with the partial carrier, e.g., as an injection-molded part, so that a process step for outfitting the partial carrier with detachable connection members is dispensed with.

In an advantageous manner, the optics carrier is substantially sleeve-shaped (hollow-cylindrical or hollow-prismatic) so that correspondingly formed components can be arranged coaxially in the interior. In addition, this kind of shape corresponds to the axial symmetry.

The assembly is advantageously constructed as adjustable and focusable collimating optics with a collimating lens and a laser diode so that an adjustable, focused beam source suitable for series production is realized.

The assembly is advantageously constructed an adjustable and focusable beamsplitter with the collimating optics as focused beam source and a beamsplitter prism so that an adjustable beam splitter which is suitable for series production is realized.

The novel features of the present invention which are considered as characteristic for the invention, are set forth in the appended claims. The invention itself, however, both as to its construction and its mode of operation, together with additional advantages and objects thereof, will be best understood from the following detailed description of preferred embodiment, when read with reference to the accompanying drawings.

BRIEF DESCRIPTION OF THE DRAWINGS

The drawings show:

FIG. 1 a cross-sectional view of collimating optics;

FIG. 2 a longitudinal cross-sectional view of the collimating optics;

FIG. 3 a cross-sectional view of a beamsplitter; and
FIG. 4 a side view of the beamsplitter.

DETAILED DESCRIPTION OF THE PREFERRED EMBODIMENT

According to FIG. 1 and FIG. 2, an optical assembly, which is in the form of focusable collimating optics 1 and is adjusted with respect to an axis A in axial distance and axial inclination, has a sleeve-shaped optics carrier 2 by which two optical components in the form of a laser diode 3 and a collimating lens 4 are fixedly pressed in. The optics carrier 2 has two partial carriers 5a, 5b, each of which secures an optical component and which are connected to one another by three axially elongate, flexible connection members 6. The connection members 6 which are symmetrically distributed on the axial end face 7 of the first partial carrier 5a are secured by frictional engagement in corresponding associated connection openings 8 of the axial end face 7 of the second partial carrier 5b so as to be displaceable axially. The connection members 6 which are constructed integral with the injection-molded partial carrier 5a as cylindrical pins are pressed into the connection openings 8 in a frictional engagement so as to be displaceable axially, these connection openings 8 being shaped as cylindrical bore holes.

According to FIG. 3 and FIG. 4, an optical assembly 1' which is adjusted with respect to an axis A in axial distance and axial inclination and which is constructed as a focusable beamsplitter has a sleeve-shaped optics carrier 2' to which two optical components in the form of pressed in focused collimating optics 1 (according to FIG. 1 and FIG. 2) and a beamsplitter prism 9 are fixedly connected. The optics carrier 2' has also two partial carriers 5a', 5b', each of which secures an optical component and which are connected to one another by three axially elongate, flexible connection members 6'. The connection members 6' which are distributed in a plane on the axial end face 7' of the first partial carrier 5a' are secured by frictional engagement in corresponding associated connection openings 8' of the axial end face 7' of the second partial carrier 5b' so as to be displaceable axially. The connection members 6', which are fixedly pressed with the partial carrier 5a' and constructed in a plurality of parts as conventional cylindrical or rectangular metal pins, are pressed into the correspondingly shaped connection openings 8' in a frictional engagement so as to be displaceable axially.

Though the present invention was shown and described with references to the preferred embodiment, such is merely illustrative of the present invention and is not to be construed as a limitation thereof and various modifications of the present invention will be apparent to those skilled in the art. It is therefore not intended that the present invention be limited to the disclosed embodiment or details thereof, and the present invention includes all variations and/or alternative embodiments within the spirit and scope of the present invention as defined by the appended claims.

What is claimed is:

1. An optical assembly, comprising an optics carrier (2, 2') which is adjustable with respect to an axis (A) and to which at least two optical elements are fixedly connected, the optics carrier (2, 2') having at least two partial carriers (5a, 5b, 5a', 5b') each of which secures an optical element; and at least three axially elongate, flexible connection members (6, 6') for connecting the at least two partial carriers (5a, 5b; 5a', 5b') to each other and which are spaced apart in a plane and are secured by frictional engagement in corresponding associated connection openings (8, 8') so as to be displaceable axially.

2. An optical assembly according to claim 1, wherein the connection members (6, 6') and the associated connection openings (8, 8') are arranged at axial end faces (7, 7') of the partial carriers (5a, 5b, 5a', 5b'), respectively.

3. An optical assembly according to claim 1, wherein the connection members (6, 6') are pin-shaped.

4. An optical assembly according to claim 1, wherein the connection members (6, 6') are formed as cylindrical pins, and the connection openings (8, 8') are formed as cylindrical bore holes.

5. An optical assembly according to claim 1, wherein the connection members (6, 6') and a respective partial carrier (5a') are formed as separate parts.

6. An optical assembly according to claim 2, wherein the connection members (6, 6') are formed integrally with a respective partial carrier (5a).

7. An optical assembly according to claim 1, wherein the optics carrier (2, 2') is sleeve-shaped.

8. An optical assembly according to claim 1, comprising adjustable and focusable collimating optics (1) with a collimating lens (4) and a laser diode (3).

9. An optical assembly according to claim 8, wherein the assembly is formed as an adjustable and focusable beamsplitter (1') with the collimating optics (1) and a beamsplitter prism (9).

* * * * *